United States Patent [19]
Hampton et al.

[11] Patent Number: 5,396,180
[45] Date of Patent: Mar. 7, 1995

[54] SYSTEM FOR MONITORING GAS INSULATED SUBSTATIONS

[75] Inventors: Brian F. Hampton; John S. Pearson, both of Glasgow, United Kingdom

[73] Assignee: University of Strathclyde, Glasgow, United Kingdom

[21] Appl. No.: 30,277

[22] PCT Filed: Sep. 30, 1991

[86] PCT No.: PCT/GB91/01678
§ 371 Date: May 3, 1993
§ 102(e) Date: May 3, 1993

[87] PCT Pub. No.: WO92/06385
PCT Pub. Date: Apr. 16, 1992

[30] Foreign Application Priority Data
Oct. 3, 1990 [GB] United Kingdom ................ 9021484

[51] Int. Cl.6 ...................... G01R 31/12; G01R 31/08
[52] U.S. Cl. ................................... 324/551; 324/520; 324/536; 340/647
[58] Field of Search ............... 324/532, 536, 547, 551, 324/557, 520; 364/484, 487, 551.01; 340/646, 647

[56] References Cited
U.S. PATENT DOCUMENTS
5,107,447 4/1992 Ozawa et al. ................ 324/536 X
5,146,170 9/1992 Ishikawa et al. .............. 324/532 X FOREIGN PATENT DOCUMENTS
0342597 11/1989 European Pat. Off. .

OTHER PUBLICATIONS
"Conference Record of the 1988 IEEE International Symposium on Electrical Insulation"; Kranz and Krump; pp. 246–249.
"Diagnostic measurements at UHF in gas insulated substations"; Hampton and Meats; pp. 137–144.

Primary Examiner—Gerard R. Strecker
Assistant Examiner—Diep Do
Attorney, Agent, or Firm—Bell, Seltzer, Park & Gibson

[57] ABSTRACT

A diagnostic measuring system (20) for gas insulated electrical substations having UHF couplers (11) fitted to bus chambers (12) monitors for partial discharge events within the chamber (12) to identify the nature and location of an emergent breakdown condition. The system (20) identifies each partial discharge event but characterizes it by amplitude and its time of occurrence with respect to the start of the 50 Hz power frequency wave. The characterized events are communicated over an optical fiber link (13) configured as a token passing ring to an analyzer (25) where a comparison is made with stored historic data characterizing known events. The analyzer (25) provides a self checking routine for the system (20). A microprocessor (36) forming part of a unit (21) associated with a plurality of couplers (11) provides data compression of events identified from these couplers.

7 Claims, 4 Drawing Sheets

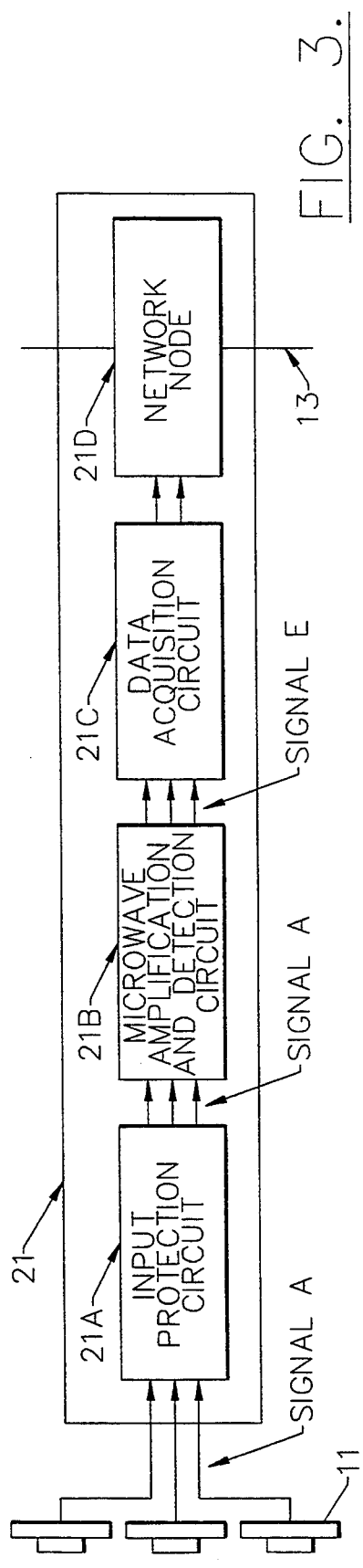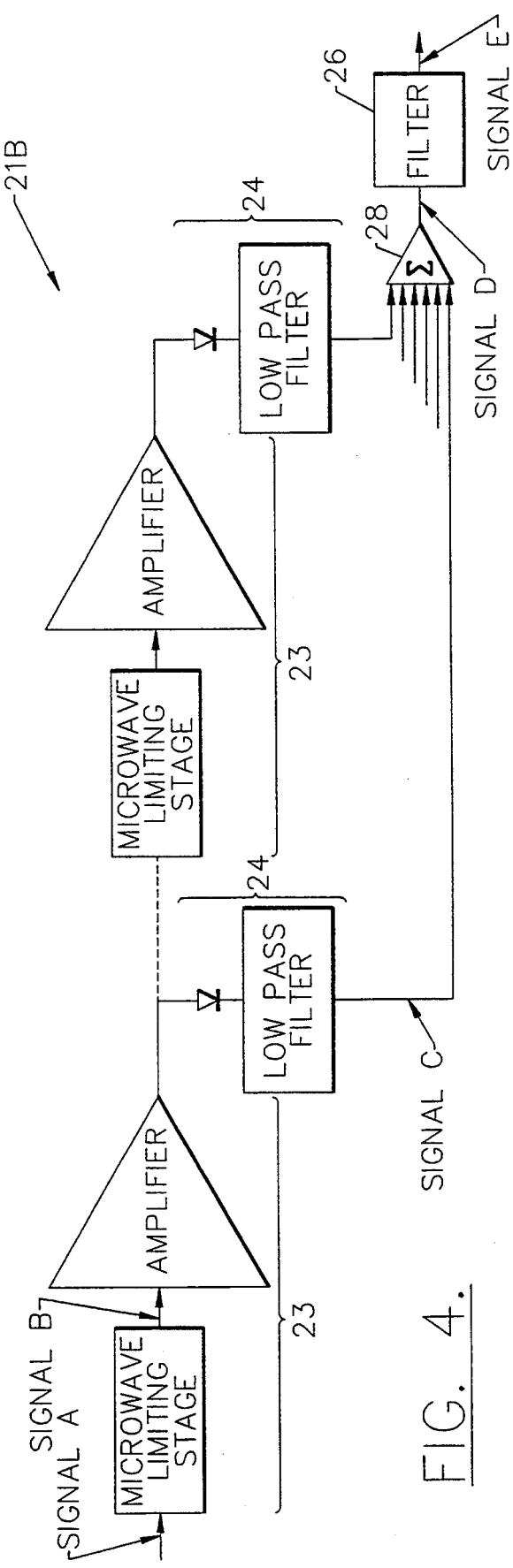
FIG. 3.
FIG. 4.

SYSTEM FOR MONITORING GAS INSULATED SUBSTATIONS

This invention relates to diagnostic measurements in gas insulated electrical substations.

Gas insulated substations (GIS) are utilised in many electricity transmission networks and are advantageous because of their being compact in size. In a GIS the conductors and circuit devices, such as transformers and switchgear, are housed within pressure vessels containing an atmosphere of sulphur hexafluoride at elevated pressure. The pressure vessels are typically made of steel and, electrically, are held at earth. In a 3-phase network the conductors of the individual phases are separately encased in pressure vessels and are mechanically mounted therein via insulators. The pressure vessels typically comprise interconnected tubular members which may have side-wall inspection ports.

Fault conditions which arise in the GIS lead to lengthy disconnection periods due to the mechanical complexity of the GIS and there is therefore a requirement to provide diagnostic measurements during in service use of the GIS in order to predict the possibility of a fault condition and to enable corrective action at a planned and convenient time. These potential faults almost always show partial electrical discharge activity before breakdown occurs and this discharge activity can be sensed from the consequential ultra high frequency resonance modes established in the pressure vessels. Accordingly the UHF modes can be sensed by couplers built into the pressure vessels at the inspection ports as has been proposed in the article entitled "Diagnostic measurements at UHF in gas insulated substations" published in PROC IEE Vol 135 Pt.C No. 2, March 1988. However, this proposal requires the use of a spectrum analyser connected to the coupler output and human interpretation of the analyser result.

The present invention provides a diagnostic measurement system for gas insulated electrical substations, the system comprising means for automatically monitoring UHF couplers fitted to pressure vessels in the substation, the monitoring means comprising means for identifying individual partial discharge events, means for characterising identified events, means for communicating characterised events from a plurality of couplers to an analysing means, the analysing means comprising pre-stored data representative of known pre-fault conditions, and comparative means for comparing the pre-stored data with the communicated characterised events, and for issuing a warning signal in the event of identity.

The identifying and characterising means preferably form part of a microprocessor sub-system associated with a plurality of couplers. The sub-system preferably comprises means for compressing a plurality of characterised events into a single data word for communicating to the analysing means. The communicating means preferably comprises an optical fibre loop. The analysing means preferably comprises means for signalling the sub-system to communicate characterised events from a particular coupler without data compression.

An embodiment of the present invention will now be described by way of example with reference to the accompanying drawings, in which:

FIGS. 1 and 2 schematically illustrate a gas insulated electrical substation and a diagnostic measurement system coupled thereto;

FIGS. 3-5 illustrate components of the measurement system; and

Figure 1:
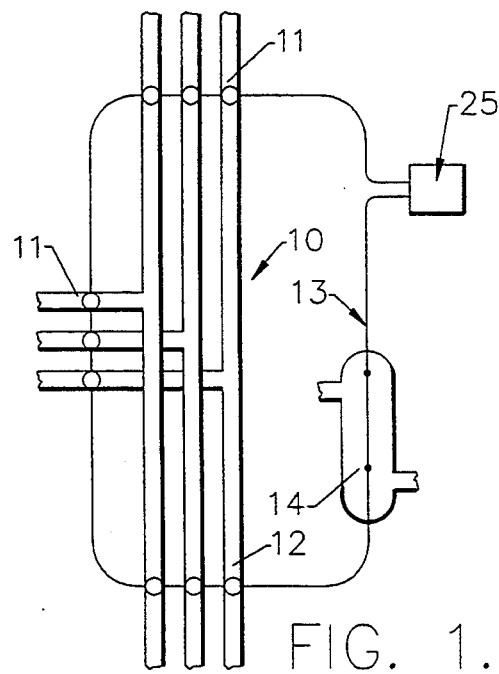
Figure 2:
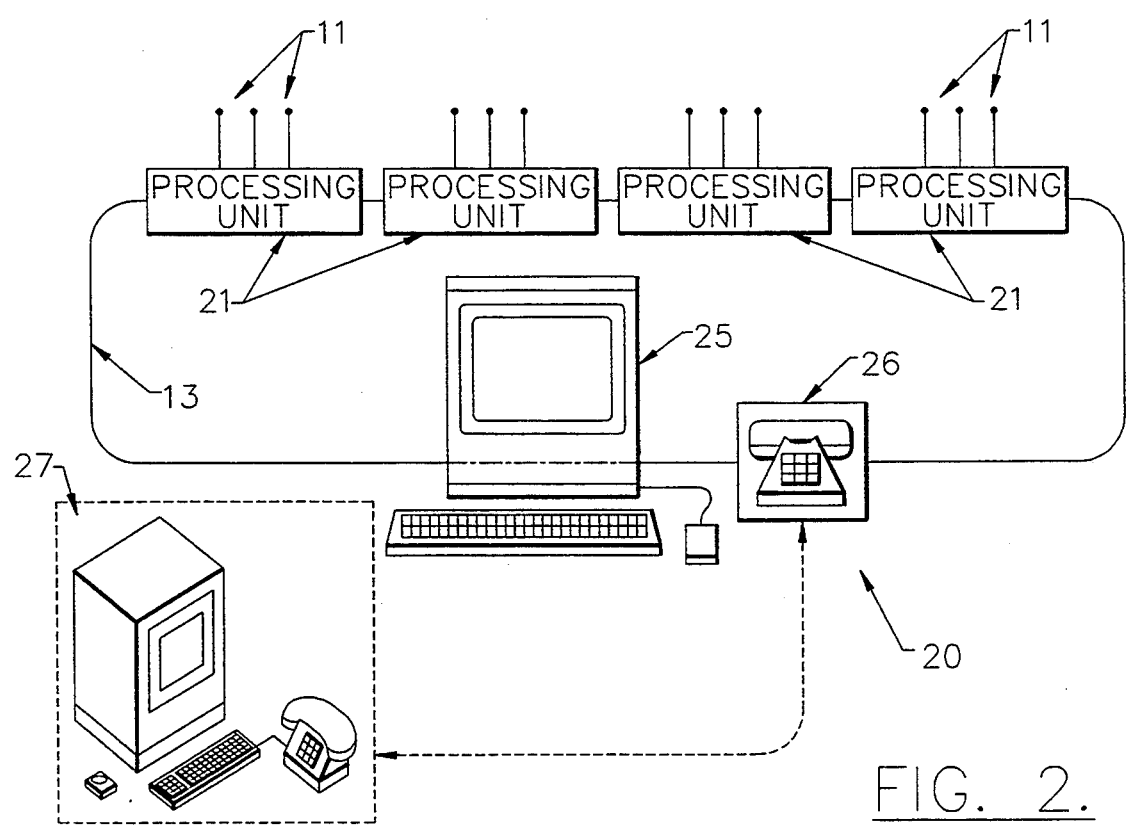

A gas insulated substation (GIS) 10 and a diagnostic measurement system 20 coupled thereto are shown schematically in FIGS. 1 and 2 wherein the UHF signals are taken from the GIS 10 using couplers 11 mounted on the inside of hatch covers formed on bus chambers 12. The couplers 11 have been designed to have a good high frequency performance, and are mechanically very robust and reliable. They may easily be fitted retrospectively to a GIS already in service.

The standard is to detect a 2 mm particle moving anywhere within the GIS, because this is below the size which might lead to breakdown. Because of the signal attenuation at these high frequencies, the couplers need to be fitted at not much more than 20 m intervals along the bus chambers 12. A typical 420 kV GIS will therefore need perhaps 20-30 three-phase sets of couplers in all.

In the continuous monitor 20, the couplers are connected to detection and pulse processing units 21 which may be implemented using a microprocessor and designed to respond to signals in the UHF region. The units 21 contain circuits for signal amplification, level detection and timing of the pulse with respect to the start of the 50 Hz power frequency wave; they are well screened externally, and also protected against the transient overvoltages arising, for example, from the operation of a nearby disconnector.

The processing units 21 digitise the outputs of each 3-phase set of couplers 11 and handle the digitised outputs together at a network node 21 D in an optical fiber loop network 13, with a unique address effectively assigned to each coupler 11. The network could contain, say, 30 nodes, and is configured as a token passing ring. It allows data transfer at 19,200 baud in one direction only using polled, exception or timed transmissions. The nodes run application specific software in conjunction with a standard shell for communications and specific register management. Any node may act as master on the network, with the main functions of starting the network operation and, for example, handling periodic token frame transmissions.

A host computer 25 may be connected as part of the network 13, and will often act as the master. It is used to store the coupler data for later processing and analysis, and to interrogate any node during the system diagnosis.

When a partial discharge (PD) occurs and the unit 21 is operating in its exception mode, it flags the system and a data token is transmitted on the network 13. This contains information on the PD amplitude, its point on wave, and the address of the coupler 11 at which the PD was detected. The token is passed to the master 25 and the data stored. Unless the PD signal level is very low, it will be detected at virtually the same time by several couplers 11 on either side of the discharge source, but the network protocol prevents token crash by storing data at the units 21 on a time-tagged basis for later transmission and processing in time order by the master 25.

On arrival at the master 25, the data is time tagged so that ordered processing may be undertaken. The master 25 also continuously monitors and can display the data, and initiates preprogrammed procedures should any threshold of signal amplitude or number of PD pulses be exceeded.

If the GIS is to be unattended, an auto-dial/auto-answer modem 26 would also be included in the network 13. This could replace the PC 25 as the network master, and initiate alarm calls to other locations such as the utility's headquarters 27.

In general the advantages of this system 20 are that the optical fibre network 13 allows interference-free communications within the noisy environment of the GIS, and the ring network 13 simplifies the installation of the system. The low baud rate reduces the chance of token loss or corruption, and together these measures give high reliability to the communications and monitoring system 20.

The integrity of the node electronics and optical fiber loop is monitored when the network operates on either timed or polled modes. Instructions can be passed from the nost, either on site 25 or remotely via the modem 26, to inject test pulses into any selected coupler 11 or its processing unit 21 so that its response may be checked. Alternatively, a self-check facility for all couplers may be used and diagnostic polling carried out at preprogrammed intervals.

In addition to the above checks, the nodes are programmed to transmit a test signal to the master 25 at timed intervals. Any failure to receive the signal indicates a break in the optical fiber ring 13, or a failure at a node. Additional checks would enable this to be located quickly.

The digitised coupler signals are normally preprocessed at the nodes of the units 21 to compress the data for transmission. This enables the complete GIS to be monitored, and the onset of a PD detected. The compressed PD signals are stored in a database at the master 25 ready for analysis. Initially this may show, for example, the most active coupler 11, with the discharge level, repetition rate and point-on-wave of the discharge. Although the database is continuously updated, skeleton data are retained so that if necessary the development of the discharge over a long period of time may be seen.

Having been informed of a developing discharge via the modem link 26, an engineer at his headquarters location 27 may request more detailed information from a particular coupler 11. In this case the other couplers 11 would be data disconnected, and the envelopes of the individual pulses from the selected coupler received directly and without preprocessing. They could then be displayed directly in real time—so that effectively the engineer would be able to examine the couplers in turn from his office. The versatility of this system allows any desired level of processing to be undertaken, and the system configured to suit individual requirements.

An active discharge in a GIS can generate vast amounts of data, and it is recognised that a site engineer may not always have the background which would enable him to decide what action to take. The detailed characteristics of various discharge conditions have already been recorded in laboratory tests, and the times before they lead to complete breakdown found. With this in comparative use at the host 25, the engineer will be presented automatically with the information he needs, which is:

the name of the GIS, if more than one is being monitored the phase and approximate location of the discharging condition the nature of the condition (free particle, disconnected shield, etc.)

the estimated time before complete breakdown.

The capacity of the optical network 13 is such that up to 100 additional channels are available to monitor other parameters in the GIS. These could be used to record any quantity of interest measured by a transducer as indicated schematically at 14; for example gas density, circuit breaker travel and contact wear.

Figure 5:
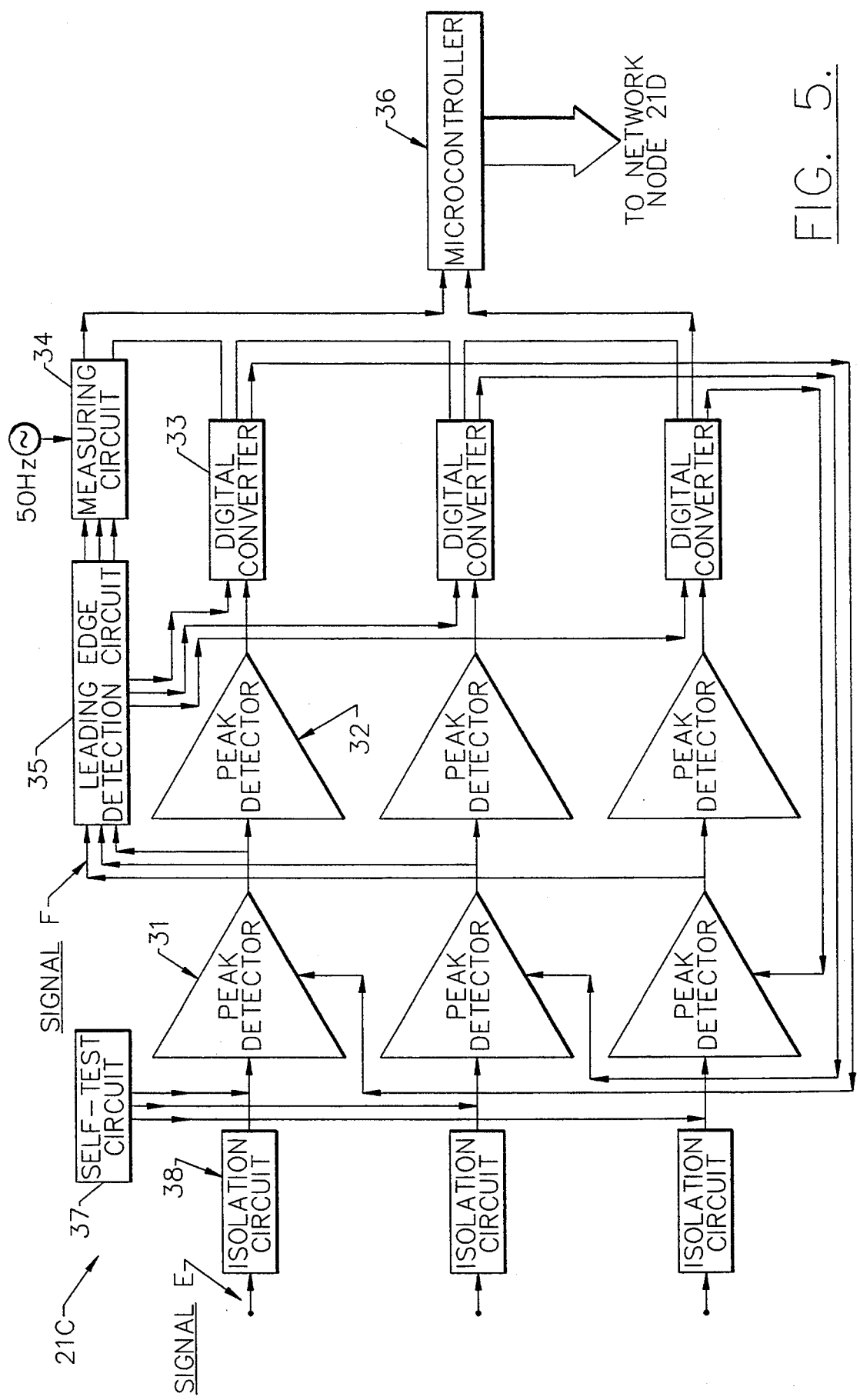

In more detail, as is shown in FIGS. 3,4 and 5 of the drawings with the accompanying signal waveforms of FIGS. 6A–6G a three-channel unit 21 is shown in FIG. 3 connected to three couplers 11 associated with respective phases of a 3-phase GIS. This arrangement is mechanically advantageous because in a 3-phase system the three couplers are usually closely grouped. The input to the unit 21 is protected in two stages against transient over voltages. First, a co-axial stub fitted at the coupler 11 acts as a high pass filter to transmit only the UHF signals of interest. Second, the input stage of the unit 21 comprises an input protection circuit 21A which utilises gas filled discharge arresters or high speed Schottky diodes to protect against exceedingly large discharge spikes. The output of circuit 21A is delivered to a microwave amplification and detection circuit 21B and which is shown more particularly in FIG. 4. Circuit 21B is designed to accept pulse signals in the frequency range 500 MHz to 1300 MHz which is in the UHF or lower microwave range and with a dynamic range of 75 dB. The dynamic range spans the lowest amplitude input signal level which typically represents a corona discharge up to the highest amplitude signal level which typically represents a floating electrode. Discharges from moving particles have an amplitude range within this dynamic range.

Figure 6A:
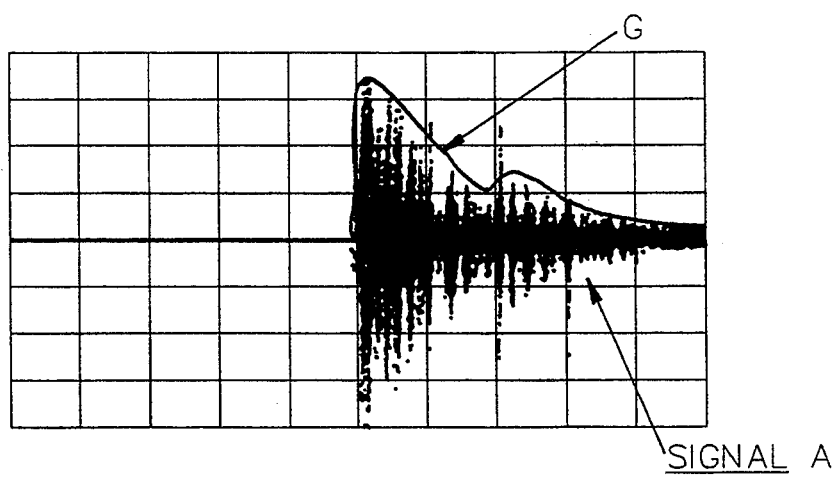
FIGS. 6A-6G illustrates typical waveforms occurring at the components of FIGS. 3-5.
Figure 6B:
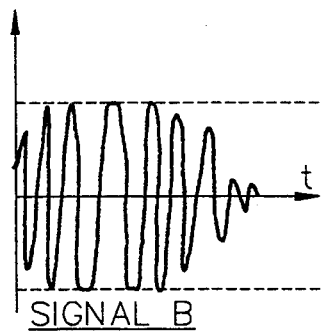
Figure 6C:
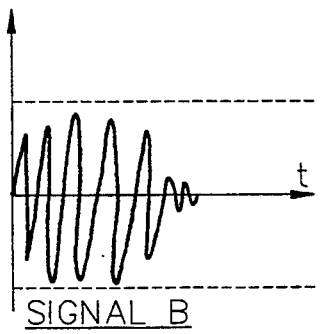
Figure 6D:
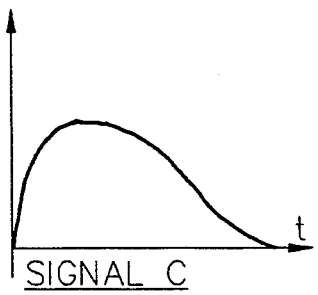
Figure 6E:
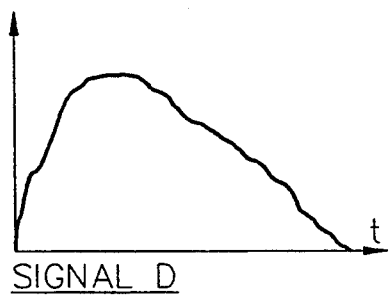
Figure 6F:
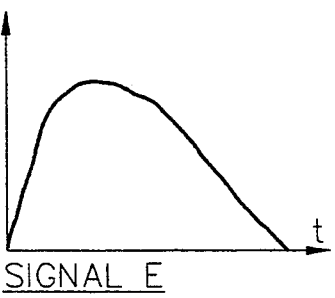
Figure 6G:
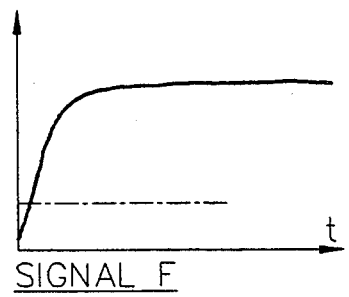

The purpose of the FIG. 4 circuit is to output a pulse (signal E) shown in FIG. 6F representing the envelope G of the UHF input pulse (signal A) shown and FIG. 6A. To achieve this and take account of the extremely large dynamic range each input pulse is processed through a ladder network of microwave diode limiting and amplification stages 23 the output of each being rectified and low pass filtered at 24 to produce a plurality of signals each as represented by signal C. Signal B is illustrated in FIGS. 6B and 6C. FIG. 6B shows signal B if amplitude greater than diode limiting. FIG. 6C shows signal B if amplitude is less than the diode limiting. At least the first stage of the ladder network will produce the signal C shown in FIG. 6D but successive stages of the ladder network may produce no signal C output due to the low signal level in these stages. All of these signals are summed by a video amplifier 28 to provide signal D shown in FIG. 6E and subsequently filtered at 26 to provide the envelope signal E. Accordingly signal E has an amplitude which is correlated with that of signal A but is smoothed to facilitate derivation of subsequent amplitude and time measurements. Although the ladder network loses the amplitude of very large signals due to diode limiting it may be inferred by measurements derived from a number of adjacent couplers.

Envelope signal E is delivered from circuit 21B to a data acquisition circuit 21C which is shown in greater detail in FIG. 5. The FIG. 5 circuit is shown for all three phases of the GIS whereas in FIG. 4 the circuit is applicable to only a single phase. In FIG. 5 the received signal E passes through an isolation circuit 38 and is peak detected and held by circuits 31,32 to enable amplitude measurement in digital form by analogue to digital converter circuit 33. The time occurrence of the leading edge of the received microwave signal is measured by circuit 34 with respect to a 50 Hz reference input signal derived from the GIS to enable the point-on-wave identification of the partial discharge event to be determined, and circuits 33 and 34 are both gated by a leading-edge detection circuit 35. Circuit 35 receives signal F shown in FIG. 6G being the output of the peak hold circuits 31 and provides a gating signal provided that the peak level of signal F exceeds a threshold. If this threshold is not exceeded the discharge event is not recorded. Each partial discharge event is characterised by its peak amplitude and the point-on-wave time of occurrence with respect to the 50 Hz reference. This information in digitised form is delivered to a micro-controller 36 which in turn delivers to the network node 21D. In normal operation the micro-controller 36 is arranged to accumulate the characterising features of a plurality of partial discharge events from either a single coupler 11 or from a group of couplers 11 and to data compress these characterising features into a single data word for delivery to the network node 21D. By way of example, the data compression may be by means of averaging the characterising features (amplitude and time) of a limited number of events (such as 20).

The circuit 21C also includes a self-test facility 37 which enables the circuit to generate either directly under control of the micro-processor 36 or indirectly under control of the master 25 a simulated input pulse to the peak detection and hold circuitry 31,32 to enable remote self-checking of the functionality of the circuit.

Essentially the host 25 having established from the received data that a discharge is present in the GIS its cause requires to be identified. This is achieved by considering over a number of power frequency cycles the point-on-wave at which the partial discharge events occur and by considering the amplitude of the events. It has already been established that when PD events occur around the peaks of the 50 Hz wave they arise from a corona source whereas if PD events occur on the rising quadrant of the positive half-cycle and the falling quadrant of the negative half-cycle they arise from a floating electrode and furthermore if PD events occur essentially uniformly over the complete 50 Hz cycle they arise from a moving particle within the pressure vessel 12. Thus the host 25 is provided with stored data representative of these known pre-fault conditions and with a comparator which enables a comparison of the pre-stored data with the communicated characterising events of any partial discharges which have arisen. The host 25 accordingly issues a warning signal in the event of any form of identity or near identity between the stored known pre-fault conditions and the communicated characterising events. In the absence of any identity the host outputs a zero signal. Furthermore when a warning signal is issued host 25 can identify and command the appropriate micro-controller 36 to cease data compression and to transmit to host 25 the specific characterising features of each and every PD event either from its communicated group of couplers 11 or from one or more selected coupler of that group.

We claim:

1. A diagnostic measurement system for gas insulated electrical substations, comprising means (20) for automatically monitoring a plurality of UHF couplers (11) fitted to pressure vessels in the substation, the monitoring means (20) comprising means (21B) for detecting individual partial discharge events, means (21C) for characterizing detected events according to amplitude and time of occurrence and for representing each characterized event in a data format, said characterizing means (21C) being responsive to said detecting means (21B), means (21D) for communicating data representing characterized events from said characterizing means to an analyzing means (25), the analyzing means (25) comprising (a) pre-stored data representative of known pre-fault conditions, and (b) comparative means for comparing the pre-stored data with the communicated data, and for issuing a warning signal in the event of identity, and means for compressing the data representing a plurality of detected events from each of said plurality of UHF couplers into a single data word for communicating to the analyzing means (25).

2. A system as claimed in claim 1, wherein the analyzing means (25) comprises means for signalling the monitoring means to communicate data representing characterized events from a particular coupler (11) without data compression.

3. A system as claimed in claim 1, wherein the communicating means (21D) comprises an optical fiber loop (13).

4. A system as claimed in claim 1 further comprising an input protection circuit (21A) electrically connected between said detecting means (21B) and a respective UHF coupler (11).

5. A system as claimed in claim 4 wherein said input protection circuit (21A) comprises a co-axial stub.

6. A system as claimed in claim 4 wherein said input protection circuit (21A) comprises a gas filled discharge arrester.

7. A system as claimed in claim 4 wherein said input protection circuit (21A) comprises a Schottky diode.

* * * * *